(12) United States Patent  (10) Patent No.: US 7,602,472 B2
Buis et al.  (45) Date of Patent: Oct. 13, 2009

(54) CONTAMINATION PREVENTION SYSTEM, LITHOGRAPHIC APPARATUS, RADIATION SOURCE, AND METHOD FOR MANUFACTURING A DEVICE

(75) Inventors: Edwin Johan Buis, Belfeld (NL); Erik Theodorus Maria Bijlaart, Rosmalen (NL); Christiaan Alexander Hoogendam, Westerhoven (NL); Alexander Matthijs Struycken, Eindhoven (NL); Arnoud Cornelis Wassink, Veldhoven (NL); Paul Peter Anna Antonius Brom, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 92 days.

(21) Appl. No.: 11/808,778

(22) Filed: Jun. 12, 2007

(65) Prior Publication Data

US 2008/0309893 A1 Dec. 18, 2008

(51) Int. Cl.
*G03B 27/52* (2006.01)
*G03B 27/42* (2006.01)

(52) U.S. Cl. .......................... 355/30; 355/53

(58) Field of Classification Search .................. 355/53, 355/67, 71, 30, 55; 250/492.2, 492.22
See application file for complete search history.

(56) References Cited

U.S. PATENT DOCUMENTS

| 2007/0115445 | A1* | 5/2007 | Box et al. ..................... 355/30 |
| 2007/0228290 | A1* | 10/2007 | Wildenberg .............. 250/492.2 |
| 2008/0157006 | A1* | 7/2008 | Wilhelmus Van Herpen et al. ....................... 250/492.2 |
| 2008/0231820 | A1* | 9/2008 | Wassink ...................... 355/30 |

* cited by examiner

*Primary Examiner*—Hung Henry Nguyen
(74) *Attorney, Agent, or Firm*—Pillsbury Winthrop Shaw Pittman LLP

(57) ABSTRACT

A contamination prevention system is constructed and arranged to prevent material from propagating with radiation into a lithographic apparatus. The contamination prevention system includes a rotatable carrier provided with a plurality of generally radially outwardly extending blades. The blades are constructed and arranged to absorb or deflect the material. The system also includes a stationary shaft, and a bearing constructed and arranged to rotate the rotatable carrier and the blades around the shaft. The rotatable carrier is provided with a space for at least partially receiving a portion of the shaft.

28 Claims, 4 Drawing Sheets

CONTAMINATION PREVENTION SYSTEM, LITHOGRAPHIC APPARATUS, RADIATION SOURCE, AND METHOD FOR MANUFACTURING A DEVICE

FIELD

The invention relates to a contamination prevention system, a lithographic projection apparatus, a radiation source, and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

The term "patterning device" as here employed should be broadly interpreted as referring to device that can be used to endow an incoming radiation beam with a patterned cross-section, corresponding to a pattern that is to be created in a target portion of the substrate. The term 'light valve' can also be used in this context. Generally, the pattern will correspond to a particular functional layer in a device being created in the target portion, such as an integrated circuit or other device. An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in case of a transmissive mask) or reflection (in the case of a reflective mask) of the radiation impinging on the mask, according to the pattern of the mask. In the case of a mask, the support structure will generally be a mask table, which ensures that the mask can be held at a desired position in the incoming radiation beam, and that it can be moved to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, thereby leaving only the diffracted light behind. In this way, the beam may be patterned according to the addressing pattern of the matrix-addressable mirrors. The matrix addressing can be performed using suitable electronics. In both of the situations described hereabove, the patterning device can comprise one or more programmable mirror arrays. In the case of the programmable mirror array, the support structure may be embodied as a frame or table, for example, which may be fixed or movable as required.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time.

In a known manufacturing process using a lithographic projection apparatus, a pattern (e.g. mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices (referred to hereinafter as 'alignment system'), this mark can then be relocated each time a new layer has to be juxtaposed on an existing layer, and can be used as an alignment reference. Eventually, an array of devices will be present on the substrate (wafer). These devices are than separated from one another by a technique such as dicing or sawing, when the individual devices can be mounted on a carrier, connected to pins, etc.

For the sake of simplicity, the projection system may hereinafter be referred to as the 'lens'. However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a 'lens'.

Further, the lithographic apparatus may be of a type having two or more substrate tables (and/or two or more mask tables). In such 'multiple stage' devices, the additional tables may be used in parallel, or preparatory steps may be carrier out on one or more tables, while one or more other tables are being used for exposures. This technique is called dual stage lithography and is known per se in the art.

In a lithographic apparatus, the size of features that can be imaged on the substrate is limited by wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation in the range 5 to 20 nm, especially around 13 nm. Such radiation is termed extreme ultraviolet (EUV) or soft X-ray and suitable sources include, for example, laser-produced plasma sources, discharge plasma sources or synchrotron radiation from electron storage rings.

In a discharge plasma source, for example, a discharge is created in between electrodes, and a resulting partially ionized plasma may subsequently be caused to collapse to yield a very hot plasma that emits radiation in the EUV range. Sn, Li and Xe plasmas may be used to radiate in the extreme UV (EUV) range around 13.5 nm.

In addition to EUV radiation, radiation sources used in EUV radiation systems generate contaminant material that may deteriorate the optics and the working environment in which the lithographic process is carried out. Such a radiation system typically comprises a pair of electrodes to which a voltage difference can be applied. In addition, plasma is produced, for example, by a laser beam that is targeted to for example, one of the electrodes. Accordingly, a discharge will occur between the electrodes which causes a so called pinch in which EUV radiation is produced. In addition to this radiation, the discharge source typically produces debris particles, which can be all kinds of micro particles varying in size from atomic to complex particles, which can be both charged and uncharged.

It is desired to shield the optical system that is arranged to condition the beam of radiation coming from the EUV radiation source from this debris. Shielding of the optical system may be done with a contamination preventing system for preventing material (debris) emanating from the source from propagating with the EUV radiation into the lithography apparatus.

Another product of the EUV radiation source is heat, which may cause the contamination prevention system to heat up. The contamination prevention system may heat up if the size of the contamination prevention system is enlarged to collect radiation over larger collection angles of the source, and may cause malfunction of the contamination prevention system. The high heat load and the high rotational speed may cause the contamination prevention system to be sensitive to unbalances and vibrations in the contamination prevention system, thereby increasing the chance of crashes. The unbalances may be started by an uneven spread of material absorbed on the blades.

SUMMARY

It is an aspect of embodiments of the invention to provide a contamination prevention system in which debris mitigation is successfully achieved, even with higher heat loads to the contamination prevention system.

According to an aspect of the invention, there is provided a contamination prevention system is constructed and arranged to prevent material from propagating with radiation into a lithographic apparatus. The contamination prevention system includes a rotatable carrier provided with a plurality of generally radially outwardly extending blades. The blades are constructed and arranged to absorb or deflect the material. The system also includes a stationary shaft, and a bearing constructed and arranged to rotate the rotatable carrier and the blades around the shaft. The rotatable carrier is provided with a space for at least partially receiving a portion of the shaft.

According to an aspect of the invention, there is provided a radiation source module that includes a radiation source constructed and arranged to generate radiation, and a contamination prevention system constructed and arranged to prevent material from propagating with the radiation into a lithographic apparatus. The contamination prevention system includes a rotatable carrier provided with a plurality of generally radially outwardly extending blades. The blades are constructed and arranged to absorb or deflect the material. The contamination prevention system also includes a stationary shaft, and a bearing constructed and arranged to rotate the rotatable carrier and the blades around the shaft. The rotatable carrier is provided with a space for at least partially receiving a portion of the shaft.

According to an aspect of the invention, a lithographic apparatus is provided that includes a radiation source constructed and arranged to generate radiation, and a contamination prevention system constructed and arranged to prevent material from propagating with the radiation. The contamination prevention system includes a rotatable carrier provided with a plurality of generally radially outwardly extending blades. The blades are constructed and arranged to absorb or deflect the material. The contamination prevention system also includes a stationary shaft, and a bearing constructed and arranged to rotate the rotatable carrier and the blades around the shaft. The rotatable carrier is provided with a space for at least partially receiving a portion of the shaft. The lithographic apparatus also includes an illumination system constructed and arranged to condition the radiation, a patterning device constructed and arranged to pattern the radiation, and a projection system constructed and arranged to project a patterned beam of radiation onto a substrate.

According to an aspect of the invention, a method of manufacturing an integrated structure by a lithographic process is provided. The method includes providing a radiation system configured to form a beam of radiation from radiation emitted by a radiation source, patterning the beam of radiation, projecting the patterned projection beam onto a target portion of a substrate at least partially covered with a radiation sensitive material, and preventing material from propagating with the beam of radiation by intercepting or deflecting the material with a contamination prevention system. The contamination prevention system includes a rotatable carrier provided with a plurality of generally radially outwardly extending blades. The carrier at least partially receives a portion of a stationary shaft. The contamination prevention system also includes a bearing configured to rotate the carrier about the shaft in a space within the rotatable carrier.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
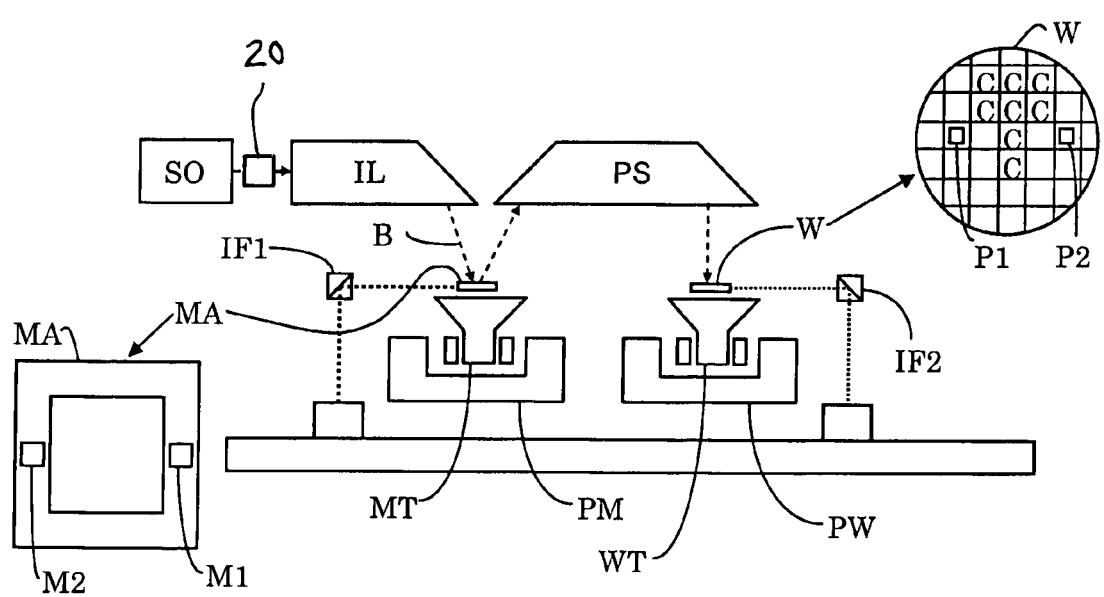
FIG. 1 depicts in a schematic way a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if desired, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
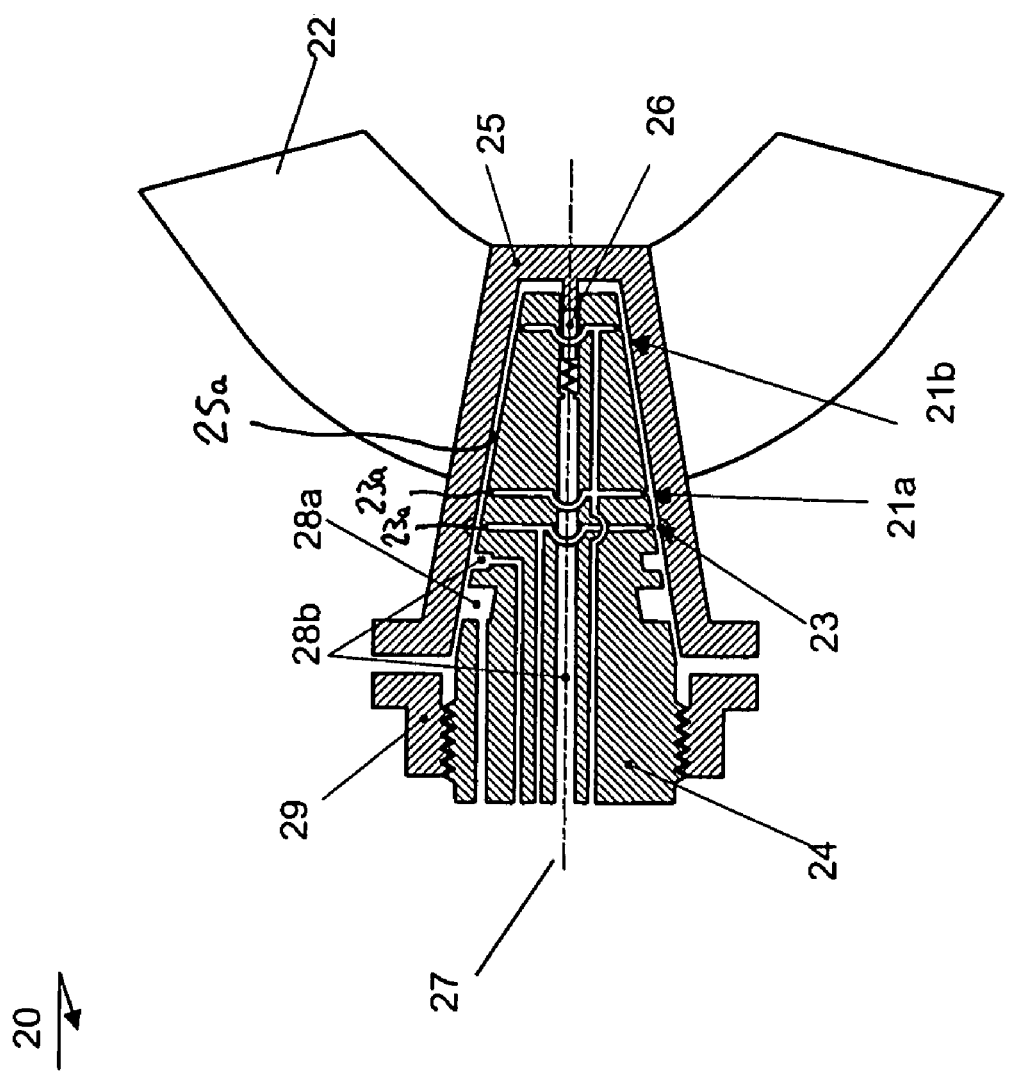
FIG. 2 depicts in a schematic way a contamination prevention system of the lithographic apparatus of FIG. 1.

FIG. 2 depicts in a schematic way a contamination prevention system according to an embodiment of the invention. The contamination prevention system 20 is configured to be positioned between the source SO and the illumination system IL of the lithography apparatus, as shown in FIG. 1. The contamination prevention system operates in a vacuum environment and is arranged to absorb or deflect material that emanates from the source to prevent the material from propagating with the radiation along the axis 27 and into the illumination system.

The contamination prevention system comprises a rotatable carrier that includes a rotatable shell 25 arranged with a series of blades 22 which extend substantially radially in an outward direction with respect to the shell. The shell 25 is arranged to receive a portion of a stationary shaft 24, which is arranged with suitable bearings 21a, 21b and a drive (such as a turbine) 23 for bearing and causing a rotation of the shell 25 about the shaft 24. The bearings 21a, 21b and drive 23 may be part of an integral unit, or may be separate. By providing at least a portion of the stationary shaft and the bearings in a space provided to the rotatable carrier, the bearings may be provided close to the center of mass of the rotatable shell and blades. The influence of unbalance and vibrations may be minimized by having the bearings close to the center of mass, thereby providing for a stable contamination prevention system.

In an embodiment, the shell 25 is cone-shaped. This may allow for the shell 25 to adjust its axial position in such a way that an optimal air gap may be achieved even though different temperatures of axle and hose, and, thus, different expansions may be encountered. The bearings 21a, 21b may be fluid bearings. Suitable examples of drives and bearings comprise pneumatic bearings and drives, which may operate using fluids such as gas and liquids. The stationary shaft 24 may be provided with suitable nozzles 23a for ejecting a stream of fluid (gas or liquid) towards an inner surface 25a of the shell 25 for driving and bearing purposes. The nozzles 23a may be part of the fluid bearings 21a, 21b or may be separate from the fluid bearings. The fluid bearings may provide for temperature control of the contamination prevention system.

During startup, the fluid may be used to heat the contamination prevention system while during normal use with the source heating the contamination prevention system, the fluid may be used to cool the contamination prevention system. An example of a liquid may be water, while the gas may be steam, or a combination of both may be used. During startup, the steam may be used to bring the contamination protection system up to 232 degrees Celsius, which may assist in reducing tin contamination, because tin contamination will stay in a liquid phase at that temperature, and by rotating the blades, tin will slide off the blades during start up. In case the bearings 21a, 21b are arranged to supply a stream of gas, the contamination prevention system 20 comprises suitable seals for sealing the gas substantially in a vicinity of the shaft. The seals may be arranged with a gas slot for controlling a chemical composition of a gas leakage into the vacuum atmosphere of the contamination prevention system. In addition, the contamination prevention system 20 further comprises a pump for gradually reducing the atmospheric pressure at regions 28b towards a medium vacuum at region 28a.

The drive may comprise an electrical drive for causing the rotation of the shell 25 about the shaft 24. A grounding electrode 26 configured to ground the rotatable carrier and the blades at the stationary shaft 24 may be provided so that the rotatable carrier and the blades may receive electrons from the source which may charge the rotatable carrier and the blades. The contamination prevention system 20 may comprise at least one magnet 29 arranged for securing the position of the shell 25 on the shaft 24. A position of the magnet 29 on the shaft 24 may be adjustable to enable a suitable dynamic control of the magnetic load on the shell 25. The stationary shaft 24 may be provided with a suitable fluid cooler for cooling the rotatable shell 25 in use. Known cooling arrangements having circulating liquid or gas may be suitable for this purpose. In an embodiment, the contamination prevention system may comprise an air flow generator arranged for preventing particles from the grounding assembly from reaching the drive. The air flow generator may be positioned on the stationary shaft.

The contamination prevention system 20 may be provided with a braking system, or brake, for enabling an emergency braking of the rotatable shell 25. For example, the brake may be arranged to reverse a rotation of the shell 25. This may be implemented by suitably adjusting the drives, so that a reverse force is applicable to the shell 25. The braking system may be arranged to cause eddy currents in a material of the shell, thereby inducing a braking force in the shell 25 for reducing a revolution speed of the shell. The braking system may include a mechanical break, which operates by bringing a part of the stationary shaft in contact with the shell.

Figure 3:
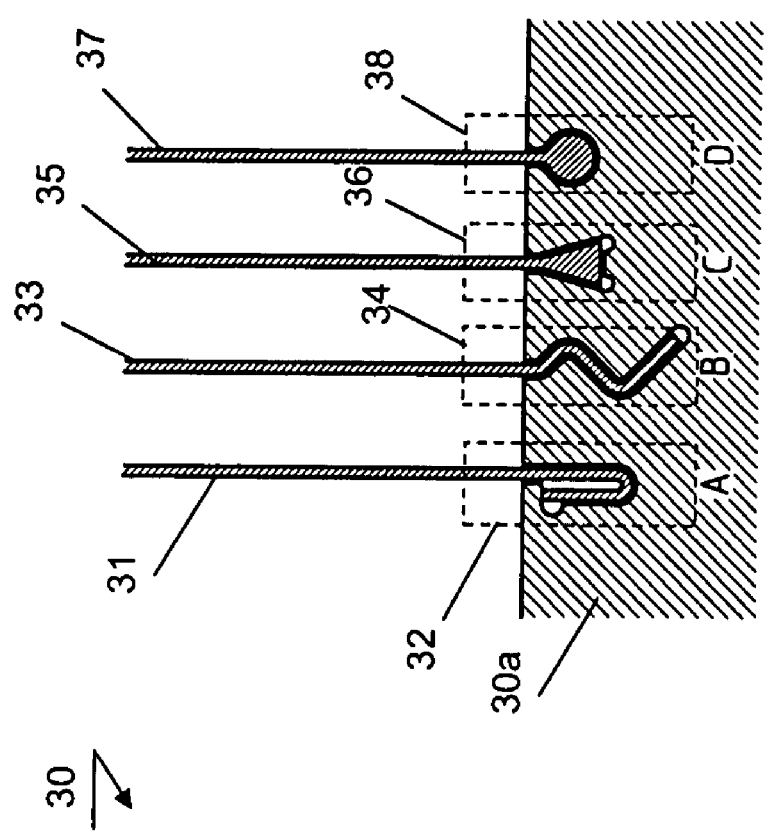
FIG. 3 depicts in a schematic way an assembly that includes a carrier and a blade.

FIG. 3 depicts in a schematic way an assembly comprising a carrier and a blade. In this figure, different configurations for securing the blade in a volume of the carrier 30a are shown. In an embodiment, a blade 31 extending radially from the carrier 30a may have a bent portion 32 which is introduced in the volume of the carrier 30a, as shown in configuration A. The bent portion 32 may be attached to the material of the carrier 30a by soldering. In an embodiment, a blade 33 has a differently shaped end portion 34, which has a snake-formed tail, as shown in configuration B. This geometry may be suitable to secure the blade 33 in the volume of the carrier 30a. In an embodiment, a blade 35 has a thickening of the end portion 36, which has edges running under an angle with respect to a plane of the blade 35, as shown in configuration C. By providing such thickening of the tail portion, the blade 35 may be securely attached to the carrier 30a. In an embodiment, a blade 37 has a ball-shaped or disk-shaped end portion 38 which is introduced into the volume of the carrier 30a, as shown in configuration D. This may enable a secure attachment of the blade 37 in the volume of the carrier 30a.

Figure 4:
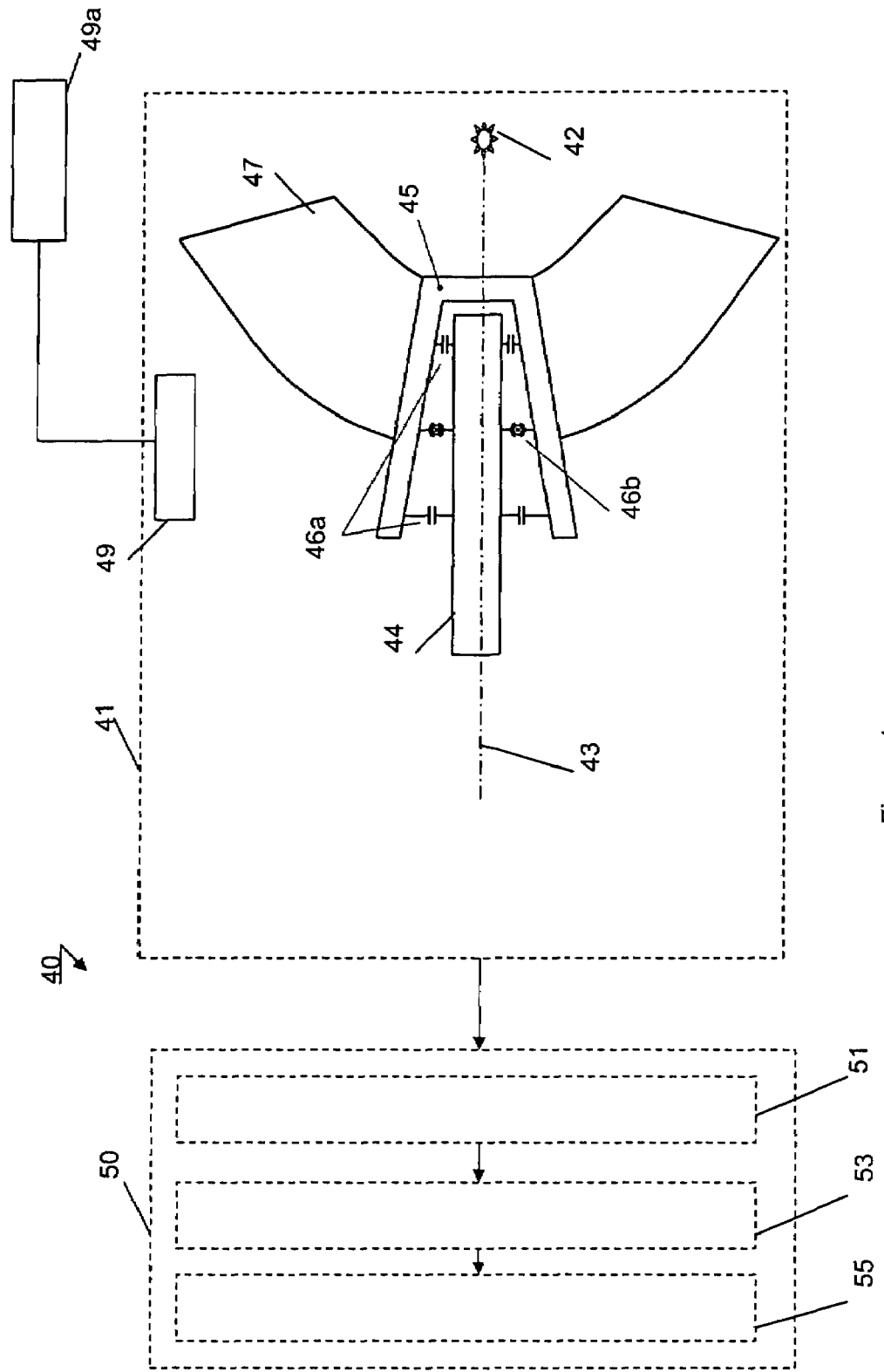
FIG. 4 present in a schematic way an embodiment of the lithography apparatus.

FIG. 4 illustrates in a schematic way an embodiment of the lithographic apparatus. The lithographic apparatus 40 com prises a radiation source module 41 with a radiation source 42 and a contamination prevention system as is discussed with reference to FIG. 2. The radiation source 42 is arranged to emit a radiation along an axis 43. Material emanating from the source 42 and propagating along the axis 43 is intercepted by the rotating blades 47. The contamination prevention system comprises a set of blades 47 mounted on a rotatable shell 45, which is driven by suitable drives 46a, 46b for causing it to rotate about the stationary shaft 44. The blades 47 are arranged radially with respect to the shell 45 and have channels between them through which the radiation can propagate without attenuation towards further modules of the lithographic apparatus 40. The source 42 and the contamination prevention system operate in vacuum in the source module 41. In accordance with an embodiment, a sensor 49 is provided for determining a revolution speed of the shell 45. The sensor may comprise a vibration sensor, like a microphone or a pressure detector, for analyzing vibration waves emanating from the blades 47 in use. The sensor 49 may be arranged in electronic communication with a control unit 49a arranged to control the drives 46a, 46b for adjusting the revolution speed of the shell 45. In this way, a feed back may be provided for controlling the operation of the contamination prevention system. The radiation beam propagating from the contamination prevention system may then be applied to the further modules 50 of the lithographic apparatus, such as an illuminator module 51, a projection module 53 and a wafer module 55. These modules are generally discussed above with reference to FIG. 1.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of about 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A contamination prevention system constructed and arranged to prevent material from propagating with radiation into a lithographic apparatus, the contamination prevention system comprising:
    a rotatable carrier provided with a plurality of generally radially outwardly extending blades, the blades being constructed and arranged to absorb or deflect the material;
    a stationary shaft; and
    a bearing constructed and arranged to rotate the rotatable carrier and the blades around the shaft, the rotatable carrier being provided with a space for at least partially receiving a portion of the shaft.

2. A contamination prevention system according to claim 1, wherein the bearing is a fluid bearing and the space is defined by a shell in the rotatable carrier.

3. A contamination prevention system according to claim 2, wherein the contamination prevention system is provided with a drive comprising a nozzle constructed and arranged to eject a fluid towards an inner surface of the shell and cause a rotation of the rotatable carrier.

4. A contamination prevention system according to claim 3, wherein the fluid is a liquid.

5. A contamination prevention system according to claim 3, wherein the fluid is a gas, and the drive comprises a fan for supplying a stream of the gas towards the inner surface of the shell.

6. A contamination prevention system according to claim 2, wherein the shaft comprises a magnet constructed and arranged to secure the shell on the shaft.

7. A contamination prevention system according to claim 1, wherein the shaft comprises a cooling unit constructed and arranged to cool the rotatable carrier.

8. A contamination prevention system according to claim 3, wherein the contamination prevention system is constructed and arranged to be operated in a vacuum, and wherein the fluid is a gas, the contamination prevention system further comprising a differential seal for sealing the drive from the vacuum.

9. A contamination prevention system according to claim 8, wherein the differential seal comprises a gas slot for controlling a chemical composition of a gas leakage into the vacuum.

10. A contamination prevention system according to claim 1, further comprising an assembly constructed and arranged to ground the rotatable carrier and the blades.

11. A contamination prevention system according to claim 4, wherein the liquid is water.

12. A contamination prevention system according to claim 3, wherein the fluid is steam.

13. A contamination prevention system according to claim 4, further comprising a pressure controller configured to control the pressure of the liquid.

14. A contamination prevention system according to claim 1, further comprising a brake.

15. A contamination prevention system according to claim 14, wherein the brake is arranged to reverse a direction of the rotation of the carrier.

16. A contamination prevention system according to claim 15, wherein the brake is arranged to induce an eddy current in the material of the carrier to reduce a revolution speed of the carrier.

17. A contamination prevention system according to claim 15, wherein the brake is arranged to bring the shaft in mechanical contact with the carrier.

18. A contamination prevention system according to claim 1, wherein the shell is substantially cone shaped.

19. A contamination prevention system according to claim 1, wherein end portions of respective blades are bent in a volume of the carrier to secure the blades on the carrier.

20. A contamination prevention system according to claim 1, further comprising a sensor configure to determine a revolution speed of the carrier.

21. A contamination prevention system according to claim 20, wherein the sensor is arranged to analyze vibration waves emanating from the contamination prevention system.

22. A radiation source module comprising:
    a radiation source constructed and arranged to generate radiation; and
    a contamination prevention system constructed and arranged to prevent material from propagating with the radiation into a lithographic apparatus, the contamination prevention system comprising
       a rotatable carrier provided with a plurality of generally radially outwardly extending blades, the blades being constructed and arranged to absorb or deflect the material,
       a stationary shaft, and
       a bearing constructed and arranged to rotate the rotatable carrier and the blades around the shaft, the rotatable carrier being provided with a space for at least partially receiving a portion of the shaft.

23. A radiation source module according to claim 22, wherein the radiation has a wavelength of about 5-20 nm.

24. A lithographic apparatus comprising:
    a radiation source constructed and arranged to generate radiation; and
    a contamination prevention system constructed and arranged to prevent material from propagating with the radiation, the contamination prevention system comprising
       a rotatable carrier provided with a plurality of generally radially outwardly extending blades, the blades being constructed and arranged to absorb or deflect the material,
       a stationary shaft, and
       a bearing constructed and arranged to rotate the rotatable carrier and the blades around the shaft, the rotatable carrier being provided with a space for at least partially receiving a portion of the shaft;
    an illumination system constructed and arranged to condition the radiation;
    a patterning device constructed and arranged to pattern the radiation; and
    a projection system constructed and arranged to project a patterned beam of radiation onto a substrate.

25. A lithographic apparatus according to claim 24, wherein the radiation has a wavelength of about 5-20 nm.

26. A method of manufacturing an integrated structure by a lithographic process, the method comprising:
    providing a radiation system configured to form a beam of radiation from radiation emitted by a radiation source;
    patterning the beam of radiation;
    projecting the patterned projection beam onto a target portion of a substrate at least partially covered with a radiation sensitive material;
    preventing material from propagating with the beam of radiation by intercepting or deflecting the material with a contamination prevention system, the contamination prevention system comprising a rotatable carrier provided with a plurality of generally radially outwardly extending blades, said carrier at least partially receiving a portion of a stationary shaft, and a bearing configured to rotate the carrier about the shaft in a space within the rotatable carrier.

27. A method according to claim 26, wherein the bearing is arranged to eject a fluid on an inner surface of the shell forming the space for providing a bearing for the rotatable carrier.

28. A method according to claim 26, further comprising determining a revolution speed of the carrier by a sensor constructed and arranged to analyze vibration waves emanating from the contamination prevention system.

* * * * *